(12) United States Patent
Todorov et al.

(10) Patent No.: US 8,853,653 B1
(45) Date of Patent: Oct. 7, 2014

(54) APPARATUS AND TECHNIQUES FOR CONTROLLING ION IMPLANTATION UNIFORMITY (71) Applicant: Varian Semiconductor Equipment Associates, Inc., Gloucester, MA (US)

(72) Inventors: Stanislav S. Todorov, Topsfield, MA (US); George M. Gammel, Marblehead, MA (US); Richard Allen Sprenkle, South Hamilton, MA (US); Norman E. Hussey, Middleton, MA (US); Frank Sinclair, Boston, MA (US); Shengwu Chang, South Hamilton, MA (US); Joseph C. Olson, Beverly, MA (US); David Roger Timberlake, Lexington, MA (US); Kurt T. Decker-Lucke, Hamilton, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/037,207

(22) Filed: Sep. 25, 2013

Related U.S. Application Data (60) Provisional application No. 61/819,080, filed on May 3, 2013.

(51) Int. Cl.
H01J 37/304 (2006.01)
G21K 5/00 (2006.01)
C23C 14/48 (2006.01)

(52) U.S. Cl.
CPC .. *C23C 14/48* (2013.01); *G21K 5/00* (2013.01)
USPC .................................................. 250/492.21

(58) Field of Classification Search
USPC .................................................. 250/492.21
See application file for complete search history.

(56) References Cited

U.S. PATENT DOCUMENTS 8,237,135 B2 * 8/2012 Vanderberg et al. ....... 250/492.3
8,735,855 B2 * 5/2014 Ninomiya et al. ....... 250/492.22

* cited by examiner

*Primary Examiner* — Kiet T Nguyen (57) ABSTRACT

A system to control an ion beam in an ion implanter includes a detector system to detect a plurality of beam current measurements of the ion beam at a first frequency and an analysis component to determine a variation of the ion beam based upon the plurality of beam current measurements, the variation corresponding to a beam current variation of the ion beam at a second frequency different from the first frequency. The system also includes an adjustment component to adjust the ion beam in response to an output of the analysis component to reduce the variation, wherein the analysis component and the adjustment component are configured to dynamically reduce the variation of the ion beam below a threshold value while the ion beam is generated in the ion implanter.

16 Claims, 6 Drawing Sheets

APPARATUS AND TECHNIQUES FOR CONTROLLING ION IMPLANTATION UNIFORMITY

This application claims priority to U.S. Provisional Patent application 61/819,080 filed May 3, 2013.

FIELD

The present embodiments relate to an ion implantation apparatus, more particularly, to ion beam uniformity control in ion implantation apparatus.

BACKGROUND

Present day manufacturing for semiconductor electronics, solar cells, and other technology relies on ion implanter systems for doping or otherwise modifying silicon and other types of substrates. A typical ion implanter system performs the doping by generating an ion beam and steering it into a substrate so that the ions come to rest beneath the surface. In many applications, ion beams having a defined shape and ion beam area such as a spot beam or ribbon beam are scanned over a substrate to implant a species into a substrate area that is larger than the ion beam area. Alternatively, a substrate may be scanned with respect to a stationary beam or both substrate and beam may be scanned with respect to one another. In any of these circumstances many applications require that a substrate be implanted uniformly over a large portion of the substrate.

One type of non-uniformity that may be produced by an ion beam is termed "micrononuniformity" and refers to the presence of regular patterns of varying ion dose on a substrate. Such patterns may appear, for example as stripes of varying ion dose that are observed when a substrate is scanned along a particular direction. For example, if an ion beam exhibits a periodic variation in beam current while a substrate is scanned, a pattern of micrononuniformity made up of high ion dose regions alternating with low ion dose regions may result. Such a periodic variation in beam current may be generated from different sources within the ion implanter. For example, mechanical sources such as vibrations within a beam processing component such as a lens may induce fluctuation (modulation) in beam current. Notably, fluctuations within a beamline component such as an electrostatic component, a magnetic component, or a mechanical component may cause changes in ion beam intensity at the substrate. In some cases, the beam position, beam size, and/or beam divergence and direction may fluctuate as the ion beam propagates through the beamline.

Moreover, the frequency associated with the periodic variation in beam current is often relatively low with respect to a frequency required to "average out" the beam current variation for a given scan speed of a substrate. For commonly used scan speeds of a substrate along a given direction, the cross-sectional dimension of the ion beam is often too small to average out such beam current variation, thereby resulting in a striped pattern of micrononuniformity being produced upon a substrate during scanning.

Other non-uniformity may result from high frequency variation in ion beam properties that are also associated with sharp changes in ion current density within an ion beam, such as "hot spots." Typically such non-uniformities may not be detected until after substrates have been processed. Moreover, depending upon the requirements of a given application, ion dose non-uniformity as little as a few tenths of one percent or even less may be unacceptable. An undetected micrononuniformity may therefore result in the inadvertent production of unusable product. It is with respect to these and other considerations that the present improvements have been needed.

SUMMARY

Embodiments are related to apparatus and methods for controlling ion beams. In one embodiment, a system to control an ion beam in an ion implanter includes a detector system to detect a plurality of beam current measurements of the ion beam at a first frequency and an analysis component to determine a variation of the ion beam based upon the plurality of beam current measurements, the variation corresponding to a beam current variation of the ion beam at a second frequency different from the first frequency. The system also includes an adjustment component to adjust the ion beam in response to an output of the analysis component to reduce the variation, wherein the analysis component and the adjustment component are configured to dynamically reduce the variation of the ion beam below a threshold value while the ion beam is generated in the ion implanter.

In another embodiment an ion implanter includes an ion source to generate an ion beam and a detector system to detect a plurality of beam current measurements of the ion beam at a first frequency. The ion implanter also includes a controller including at least one computer-readable storage medium comprising instructions that, when executed, cause the controller to: determine a variation of the ion beam based upon the plurality of beam current measurements, the variation of the ion beam corresponding to a beam current variation of the ion beam at a second different from the first frequency; and generate a signal for performing adjustment of a parameter in the ion implanter when the ion beam variation is above a threshold.

DETAILED DESCRIPTION

The embodiments described herein provide apparatus and methods for treating or controlling an ion beam in an ion implanter. Examples of an ion implanter include a beamline ion implanter. The ion implanters covered by the present embodiments include those that generate "spot ion beams"

that have a cross-section that has the general shape of a spot and those that generate "ribbon ion beams" or "ribbon beams" having an elongated cross-section. In the present embodiments, a system is provided to dynamically control ion beam uniformity in an ion implanter). The system includes a detector (or detector system) that is employed to measure or sample ion beam current in an ion beam, an analysis component that determines a non-uniformity in the ion beam based upon the sampled ion beam current, and an adjustment component that adjusts a parameter of the ion implanter as a result of the determined non-uniformity. The adjustment to the ion implanter is performed in a dynamic manner, that is, parameters that control ion beam properties are dynamically adjusted while the ion beam is directed through the ion implanter and measured. This process may be performed in a closed loop that attempts in an iterative fashion to adjust ion beam properties through adjustment to a parameter or parameters of the ion implantation apparatus until the sampled ion beam current indicates that the non-uniformity has receded below a threshold value.

The present embodiments thus provide real-time detection of potential causes for micrononuniformity that may be produced on a substrate such as a semiconductor wafer. This provides an advantage over present approaches which detect micrononuniformity after completion of substrate processing, which may take place after complete devices are fabricated on a batch or batches of substrates, or after extensive off-line measurements are conducted after an implantation process is complete. The real-time detection of conditions within an ion implanter responsible for producing micrononuniformity patterns in a substrate facilitate automated closed loop control for adjusting or "tuning" an ion beam. This produces a more optimal setup process and/or the ability to readily detect problems with various hardware components of the ion implanter, including improper rebuild after preventive maintenance operations.

Figure 1A:
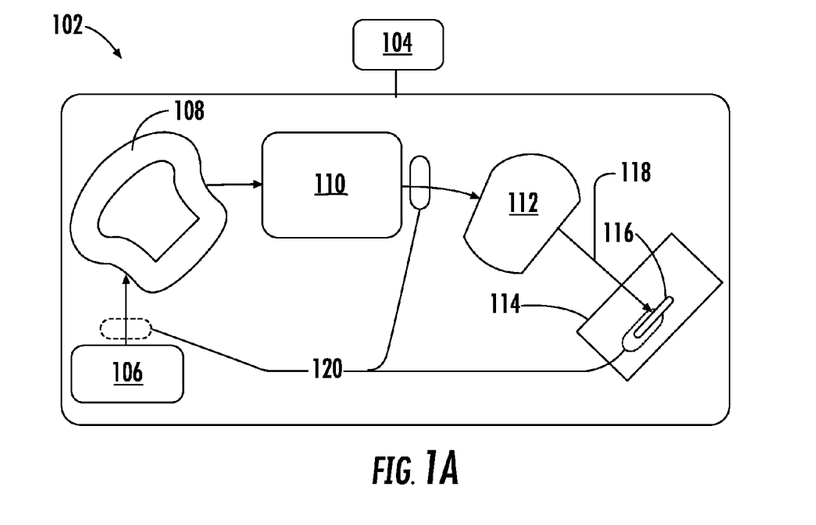
FIG. 1A depicts an exemplary ion implanter.

FIG. 1A depicts an ion implanter 102 having a control system 104 that is used to dynamically adjust hardware or components of the ion implanter. Those skilled in the art will recognize the ion implanter of FIG. 1 is a beamline ion implanter and may be referred to as such herein. The ion implanter 102 may include various conventional components including an ion source 106, magnetic analyzer 108, corrector magnet 112 and substrate stage 114. In various embodiments the beamline ion implanter 102 generates the ion beam 118 as a spot type ion beam or ribbon beam. The beamline ion implanter 102 may include various additional beam processing components that may shape, focus, accelerate, decelerate, and bend the ion beam 118 as it propagates from the ion source 106 to substrate 116. For example, a scanner 110 may be provided to scan a spot ion beam 118 with respect to the substrate 116.

The ion implanter also includes one or more ion current detectors 120, which may be Faraday detectors in some embodiments. The detectors 120 may be positioned at various locations within the beamline ion implanter 102 and may be stationary or movable in various embodiments. The current output of key power supplies providing power to certain implanter optical elements may also be monitored; i.e. power supplies may also serve as "detectors". As further illustrated in FIG. 1B the detectors 120 may form part of the control system 104 that dynamically adjusts a parameter or parameters of the ion implanter 102 to reduce variation in the ion beam 118. The adjusted parameter(s) are associated with one or more components of the ion implanter 102 including, in addition to those components depicted in FIG. 1A, any ion beam processing element such as a focusing element, an ion beam lens, a movable aperture, a beam steering component. The embodiments are not limited in this context.

Figure 1B:
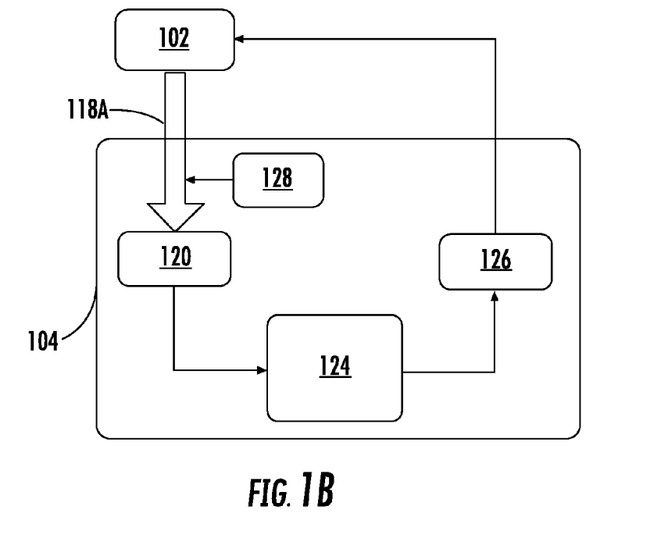
FIG. 1B depicts an exemplary control system.

Turning now to FIG. 1B, there are shown details of the control system 104 consistent with various embodiments. As detailed below the control system generally includes a detector that is configured to perform one or more beam current measurements of an ion beam at a respective one or more instances. The control system also includes an analysis component 124 used to determine ion beam variation produced by the ion beam based upon the one or more beam current measurements. The ion beam variation may be an ion beam (current) modulation (fluctuation) that takes place at a regular frequency. The ion beam variation may include modulation in ion beam size and/or modulation in ion beam position. In particular embodiments, the ion beam variation may also be modulation (fluctuation) of the beam position in the wafer plane. The ion beam variation may alternatively be a sharp gradient in beam current or "hotspot" and/or a change in beam height. The control system also includes an adjustment component to adjust a parameter of the ion implanter to reduce the detected ion beam variation. The control system 104, and in particular, the analysis component and beam adjustment component, are configured to dynamically reduce ion beam variation while the ion beam is generated in the ion implantation apparatus.

In the embodiment pictured, the system 104 is configured to receive a beam portion 118A of the ion beam 118 in order to measure and determine ion beam current and variation in beam current and to adjust parameters of the ion implanter 102 as appropriate based upon the determined variation in beam current. The control system 104 includes the detector(s) 120, beam steering controller 128, an analysis component 124, and beam adjustment component 126. In various embodiments, the beam portion 118A received by the detector 120 may be the entire ion beam 118 or just a portion that is less than the entire ion beam 118.

The system 104 and components therein may comprise various hardware elements, software elements, or a combination of both. Examples of hardware elements may include devices, components, processors, microprocessors, microcontrollers, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

In the discussion to follow various embodiments are disclosed for detecting ion beam variation (ion beam modulation) using beam current sampling techniques that are designed to detect ion beam modulation up to a given frequency (modulation frequency). In particular beam current sampling is performed at a designated frequency to capture ion beam modulation that may occur at frequencies different from the designated frequency. In some embodiments the modulation frequency is less than the sampling frequency and in particular embodiments is less than ½ the sampling frequency. In these situations, some of which are detailed below, a characteristic frequency identified by Fourier transform analysis of beam current modulation is unique. However, in other embodiments the modulation frequency may exceed the sampling frequency in which case an FT analysis may generate the same analyzed frequency for a family of modulation frequencies.

In particular modes of operation used to detect ion beam modulation, the detector 120 may sample the beam portion 118A at a plurality of instances such as a plurality of consecutive regular periods. Sampling may take place, for example at a frequency of 1024 Hz or other frequency. The terms "sample" or "sampling" as used herein generally refer to measuring the beam current of the ion beam over a set of predetermined sample periods which may be consecutive to one another where beam current may be recorded for each sample period. Sampling may involve measuring a portion of the ion beam 118 such as the beam portion 118A, which may be less than the entire ion beam 118. For example, during each sampling period total detected beam current detected in a single detector or set of detectors that measures a portion of the ion beam 118 may be summed and stored. The term "sampling period" is the inverse of "sampling frequency." Thus, a sampling frequency of 1024 Hz corresponds to a sampling period of ¹⁄₁₀₂₄ seconds, or about 1 ms. In other embodiments, the sampling frequency may be lower, such as any frequency greater than 16 Hz.

In some examples, a single Faraday detector within an array of Faraday detectors may be employed for beam sampling by the control system 104. The control system 104 may set a sampling run duration to be between a few tenths of one second to several seconds to several tens of second in some examples. The term "sampling run" refers to the recording and/or accumulation of multiple beam current measurements over multiple sampling periods which take place over consecutive periods. Accordingly, over a typical sampling run duration of a few seconds a series of several thousand sample measurements may be performed for a sampling period of about 1 ms.

In other modes of operation beam current in an ion beam may be continuously measured and beam current data from the ion beam analyzed in a continuous, intermittent or periodic fashion.

As detailed further below, the analysis component 124 may receive the accumulated data from a sampling run and may process the data using various operations such as a Fourier Transform algorithm. The results of the processing of a sampling run by analysis component 124 may then be fed to the beam adjustment component 126, which may send signals when appropriate to adjust a parameter of component(s) of the ion implanter 102 in order to reduce the variation in the ion beam 118.

The control system 104 affords the ability to reduce ion beam variation in real-time so that potential problems such as micrononuniformity in ion dose over a substrate that result from ion beam variation during substrate processing can be prevented or rapidly eliminated. In particular, in various embodiments, the control system 104 acts to identify and reduce or eliminate variation in beam current of the ion beam that may be systematic and/or periodic as a function of time. As discussed above, such periodic variations of beam current in an ion beam can be especially problematic because the periodic variations may generate micrononuniformity that is manifested as patterns such as alternating stripes of varying ion dose on a substrate being subjected to the ion beam.

Figure 2:
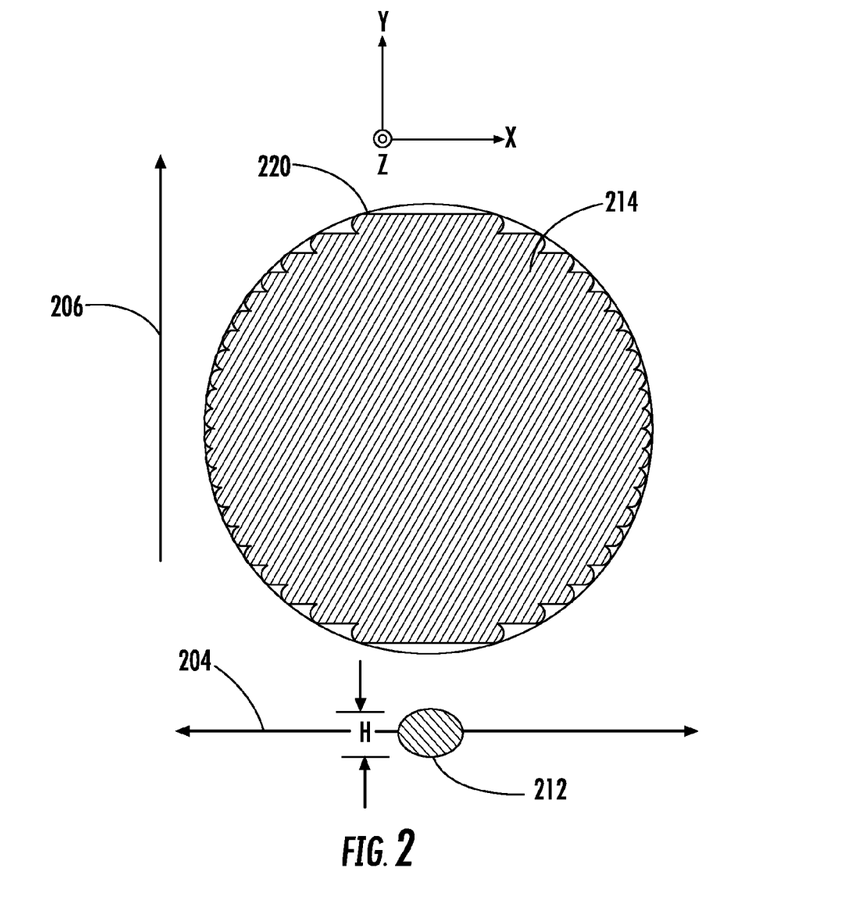
FIG. 2 depicts a plan view showing results of substrate processing using a control system consistent with the present embodiments.

FIG. 2 shows depiction of an ion dose pattern on a substrate after adjustment by control system 104 of an ion beam that may initially experience a periodic variation in beam current. In the example of FIG. 2, a substrate 220 is processed by an ion beam 212, which is a spot beam. The viewing perspective of FIG. 2 is a top plan view showing the surface of the substrate 220 exposed to the ion beam 212 in the X-Y plane of the Cartesian coordinate system shown. The ion beam 212 may be scanned back and forth along the direction 204 (X-direction) while the substrate 220 is moved along the direction 206 (Y-direction), which may be perpendicular to the direction 204. In this manner, the entire substrate 220 may be exposed to the ion beam 212.

In the absence of the control system 104 the ion beam 212 may experience a periodic variation in beam current such that a pattern of micrononuniformity made up of high ion dose stripes alternating with low ion dose stripes is generated. Such a periodic variation in beam current may be generated from different sources within the ion implanter 102. For example, mechanical sources such as vibrations within a beam processing component such as a lens may induce fluctuation (modulation) in beam current. Notably, fluctuations within a beamline component such as an electrostatic component, a magnetic component, or a mechanical component may cause changes in ion beam intensity at the substrate 220. In some cases, the beam position, beam size, and/or beam divergence and direction may fluctuate as the ion beam 212 propagates through the beamline.

The control system 104 addresses this problem by detecting beam variation so that adjustments can be performed to avoid delivering non-uniform ion dose to the substrate. In particular, in various embodiments, the system 104 is configured to generate a beam current sampling rate sufficient to identify such beam current modulation and to dynamically adjust parameters of an ion implanter to reduce or eliminate the beam current modulation, resulting in delivery of more uniform ion dose to a substrate. Accordingly, as shown in FIG. 2 a dynamically adjusted ion beam, that is, ion beam 212, is delivered to the substrate 220. This results in a uniform ion dose region 214 in which the ion dose per unit area is uniform across the substrate 220.

As previously noted, in various embodiments, beam current sampling is performed at a detector such as a Faraday detector 120—that intercepts at least a portion of the ion beam. The sampling frequency or rate is set to be sufficiently rapid that beam current fluctuations from many typical sources in an ion implanter are readily detectable. For example, the sampling frequency may be 512 Hz, 1024 Hz, or 2048 Hz in different instances. The embodiments are not limited in this context. Consistent with the present embodiments, the beam current sampling for a given sampling run that is registered by detector 120 is recorded as data expressing the variation in detected beam current or power in the time domain. In one example in which a 10 Hz beam modulation is measured for 10 seconds, the detected beam current fluctuates between minima and maxima one hundred times.

It is to be noted that an ion implanter may have multiple different components that if not properly adjusted generate beam current modulation. Because a substrate is generally located at the furthest point downstream from the ion source, the substrate may be subject to ion beam modulation from any of these components. Moreover, the modulation frequency may vary among the different components. Accordingly, in different scenarios beam current data may be sampled by the detector 120 corresponding to a single modulation frequency or multiple different modulation frequencies.

Figure 3A:
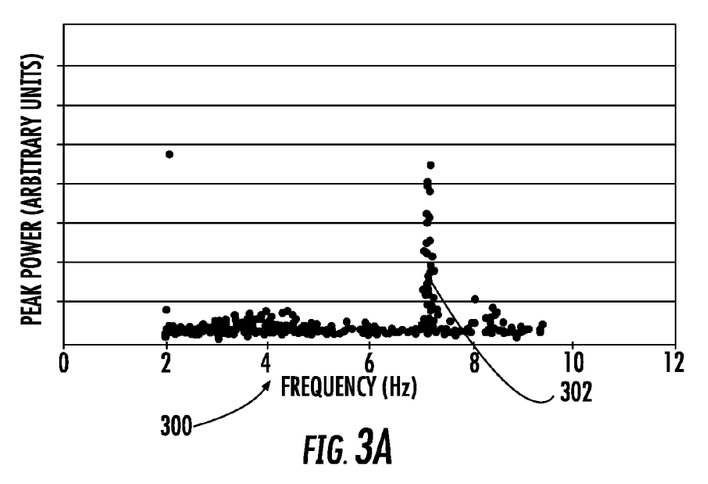
FIG. 3A depicts a first exemplary Fourier transform spectrum.

Subsequently, the analysis component 124 may perform a Fourier transform (FT) operation on the sampled beam current data to transform the beam current data into a frequency domain spectrum that expresses power as a function of frequency. In the case in which periodic modulation of beam current is recorded by a detector 120, such a FT spectrum may exhibit one or more peaks at one or more respective frequencies, where each peak at a respective frequency is characteristic of a given modulation in beam current generated by a particular component of the ion implanter FIG. 3A depicts one exemplary FT spectrum 300 that exhibits a peak 302 at a frequency of about 7 Hz. The FT spectrum 300 represents a frequency domain power spectrum where area under the curve is related to power. In one example, the peak 302 may be identified by the analysis component 124 as follows. A figure of merit (FOM) may be calculated for the peak 302 and any other identified peaks. In some embodiments the FOM is defined as the ratio of the power contained in the peak in question to the total power in the frequency domain power spectrum. If the FOM exceeds a predetermined threshold the analysis component 124 may flag (send) the identified peak to the adjustment component 126 so that adjustments to an ion implanter parameter may be performed. The adjustments performed by the adjustment component 126 may lead to a reduction in the modulation in beam current associated with the identified peak 302. In the example of FIG. 3A, the FOM calculated from the peak 302 may be deemed to exceed a threshold and therefore may trigger ion implanter adjustment by the adjustment component 126.

Figure 3B:
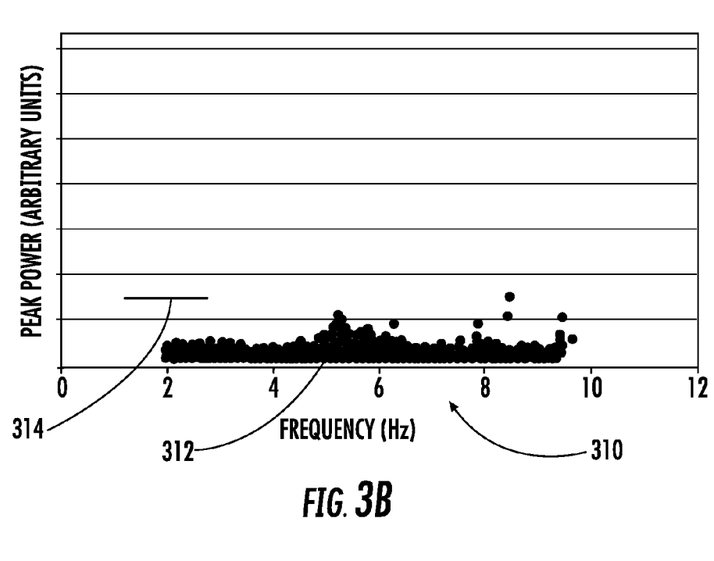
FIG. 3B depicts a second exemplary Fourier transform spectrum.

FIG. 3B depicts another exemplary FT spectrum 310 that exhibits a peak 312 at a frequency of about 5 Hz. In this example, the peak 312 may be identified by the analysis component 124. In this case the peak 312 has a low intensity such that the FOM calculated from the peak 312 does not exceed the predetermined threshold, which is schematically shown in the FIG. 3B as the level 314. Accordingly, the analysis component 124 may determine that the identified peak is not be flagged to the adjustment component 126 since a determination has been made that the fluctuation in beam current density represented by the peak 312 is not sufficient to require remedy.

In response to a determined peak in an FT spectrum of sampled beam current, in accordance with various embodiments the adjustment component 126 may determine what parameters of an ion implanter are to be adjusted. For example, in embodiments in which the adjustment component 126 is included in a controller, the controller may be coupled to multiple beamline components including power supplies for different components, movable apertures, and so forth. The controller may additionally be preconfigured with selected parameters that may be adjusted in the various components to attempt to reduce or eliminate the detected ion beam current modulation (fluctuation). In one instance the adjustment component 126 may include control software that is designed to send control signals to retune selected parameter(s) of the ion implanter in order to eliminate the beam current modulation or to reduce the beam current modulation below a threshold.

In various embodiments control signals may be sent to adjust operation of a rotating mass slit by performing at least one of the following. A signal may be sent to optimize the analyzer magnet so that the ion beam is threaded more precisely through a rotating mass slit in order to avoid periodic modulation that may be caused by the rotating mass slit. A signal may be sent to increase the size of the opening in the rotating mass slit to reduce any interaction with an ion beam passing therethrough. A signal may be sent to stop rotation of a rotating mass slit and to operate the ion beam while stationary.

In some embodiments, the adjustment component and/or analysis component may be configured to perform a determination of the appropriate hardware/parameter to be adjusted based upon the frequency of the detected peak in the FT spectrum. For example a 28 Hz peak may be characteristic of a rotating mass slit malfunction while a 4 Hz peak may indicate a focusing element problem.

In various embodiments, the control system 104 may be configured to perform a series of closed loop cycles, also termed beam adjustment loops. Each beam adjustment loop includes a sampling run that includes a plurality of beam current measurements of the ion beam, followed by a determination of ion beam variation and an appropriate beam adjustment based upon the results of the sampling run. The control system may be configured to perform multiple beam adjustment loops until the ion beam variation is below a threshold. One example of a threshold is the aforementioned threshold for a figure of merit calculated from peaks in a Fourier transform spectrum of the beam current data collected in a sampling run. Thus, if, after a series of adjustments, the peak(s) in such a spectra are reduced to the extent that the FOM no longer exceeds the threshold, further adjustment to beamline components may be ceased.

In some embodiments, the control system such as control system 104 may be configured to terminate an ion beam process after a given number of beam adjustment loops are performed if the ion beam variation still exceeds a threshold. This may signal to an operator that the ion implantation apparatus is not able to automatically correct components to bring the beam current variation within a tolerable range, and that manual intervention is necessary.

In one particular implementation, if, after a predetermined number of beam adjustment loops, a subsequently performed beam current sampling run indicates that the retuning of the selected parameter(s) does not produce the desired improvement in ion beam modulation, the control system 104 may be configured to disable the ion beam from entering a wafer stage. For example, the control system 104 may send a control signal to an interlock that is enabled to stop wafer processing until the cause for excessive beam modulation is identified and rectified by other means.

In additional embodiments, instead of detecting beam current modulation, the control system 104 may be configured to detect ion beam variation that is manifested as changes in ion beam position or changes in ion beam size. In these latter embodiments, the control system 104 may include a beam steering controller 128 that is be configured to generate a beam steering signal to purposely introduce beam clipping of the ion beam being sampled. For example, the beam steering signal may steer the ion beam so that a portion of the ion beam is intercepted by a beamline aperture. By doing so, a spatial modulation of the ion beam such as a change in position or in ion beam size, may translate into a modulation of ion current intensity, or level of current recorded by a detector. In particular, in some circumstances modulation in ion beam position and/or beam size, which may lead to non-uniform implantation, may not be detected as modulation in ion beam intensity at a given detector. For example, if an ion beam shifts position without changing beam intensity, the beam current measured by beam current detectors may not vary if the shifted ion beam still reaches beam current detectors unobstructed. However, if an aperture or other beam blocking element is arranged to block portions of an ion beam if the ion beam shifts position beyond or becomes larger, the beam current detected downstream of the aperture may vary when a portion of the shifted beam is intercepted by the aperture.

Figure 4A:
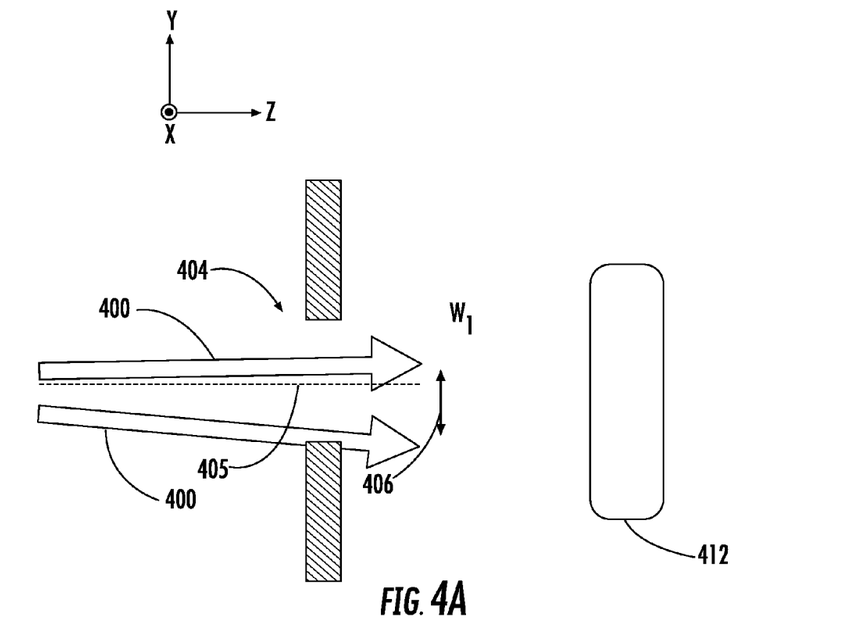
FIG. 4A shows a scenario in which an ion beam is steered through an aperture and detector arrangement to detect modulation in ion beam position and/or ion beam size.
Figure 4B:
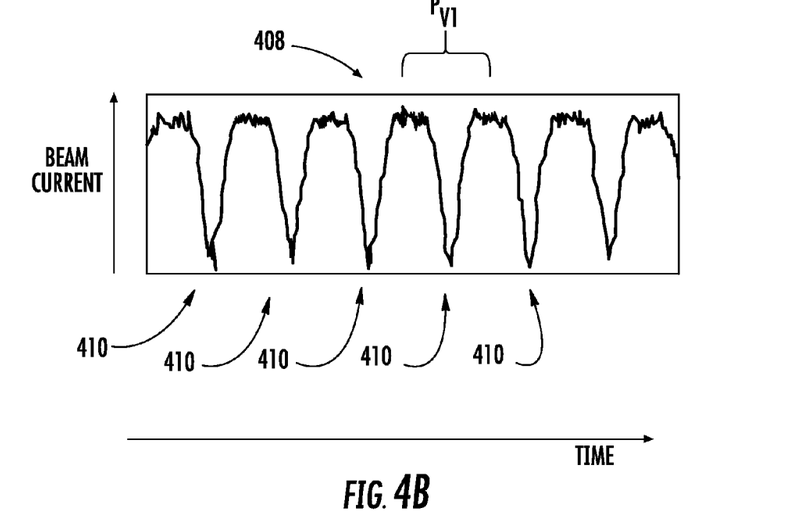
FIG. 4B illustrates an exemplary beam current curve produced by the arrangement of FIG. 4A.

Accordingly, in order to ascertain the presence of beam position modulation or beam size modulation, the ion beam may be steered through an aperture that screens for such modulation. Referring to FIG. 4A, there is shown a scenario in which the ion beam 400 is steered through an aperture 404 that screens for modulation in ion beam position and/or ion beam size. The aperture 404 may be a regular aperture in a beamline apparatus that is used for additional purposes or may be a dedicated aperture to detect ion beam modulation. A beam current detector 412 is located downstream of the aperture 404 to record beam current and variation in beam current. In particular, the beam current detector may perform sampling runs as generally described hereinabove. Under desired conditions in which the ion beam 400 does not experience excessive modulation in beam position, the aperture 402 may be configured to transmit the ion beam 400 without intercepting or blocking any of the ion beam 400. However, if the position of the ion beam 400 fluctuates in a regular manner between the two different positions shown, the ion beam 400 is partially blocked when in the lower position, where it deviates from a center line 405, resulting in the ion beam current curve 408 as shown in FIG. 4B. Notably, the beam current curve 408 exhibits a regular series of troughs 410 when the ion beam 400 is intercepted by the aperture 404. Accordingly, the aperture 402 serves the function of transforming modulation in ion beam position into a modulation in detected beam current, which may then be corrected by performing the appropriate adjustment to a suspect beamline component as described above.

Figure 5A:
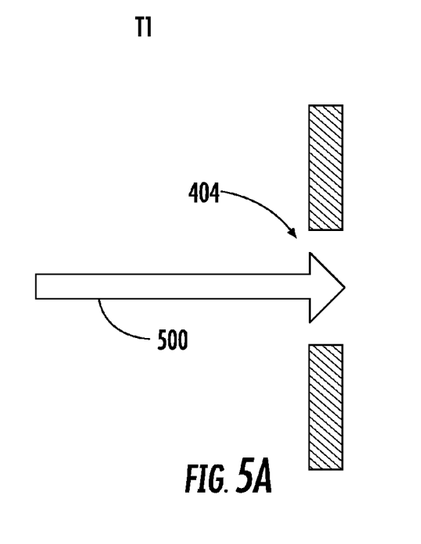
FIGS. 5A and 5B shows another scenario in which an ion beam is steered through an aperture and detector arrangement to detect modulation in ion beam position and/or ion beam size.
Figure 5B:
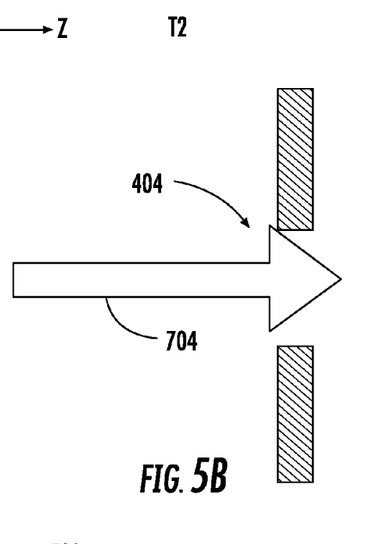
Figure 5C:
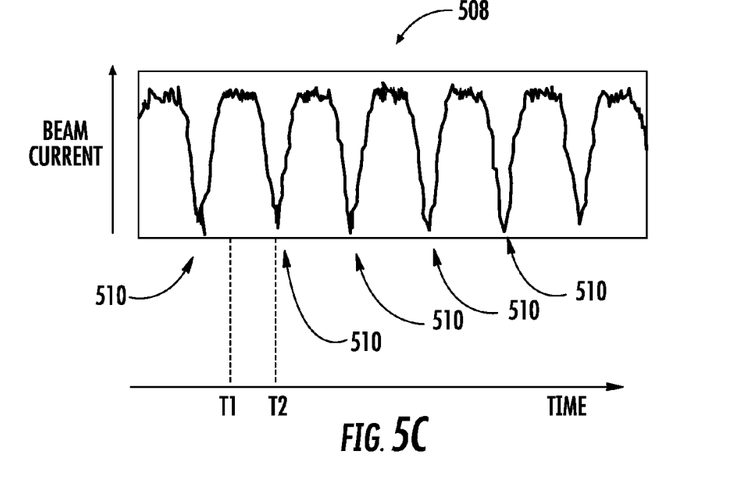
FIG. 5C illustrates an exemplary ion beam current curve produced by the scenario depicted in FIGS. 5A and 5B.

Turning now to FIG. 5A, there is shown another scenario in which the ion beam 500 is steered through an aperture 404 that screens for modulation in ion beam position and/or ion beam size. A beam current detector (not shown) may be located downstream of the aperture 404 to record beam current and variation in beam current as in the scenario of FIG. 4A. Under desired conditions in which the ion beam 500 does not experience excessive modulation in beam size, the aperture 404 may be configured to transmit the ion beam 500 without intercepting or blocking any of the ion beam 500, as illustrated in FIG. 5A. However, if the size of the ion beam 500 fluctuates in a regular manner, between the instance T1 in FIG. 5A and an instance T2 shown in FIG. 5B, the ion beam 500 becomes partially blocked by the aperture 404 in its enlarged state, resulting in the beam current 508 that exhibits a regular series of troughs 510, as shown in FIG. 5C. Accordingly, the aperture 404 serves the function of transforming modulation in ion beam size into a modulation in detected beam current, which may then be corrected by performing the appropriate adjustment to a suspect beamline component as described above.

Included herein is a flow chart representative of exemplary methodologies for performing novel aspects of the disclosed architecture. While, for purposes of simplicity of explanation, the one or more methodologies shown herein, for example, in the form of a flow chart or flow diagram, are shown and described as a series of acts, it is to be understood and appreciated that the methodologies are not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

Figure 6:
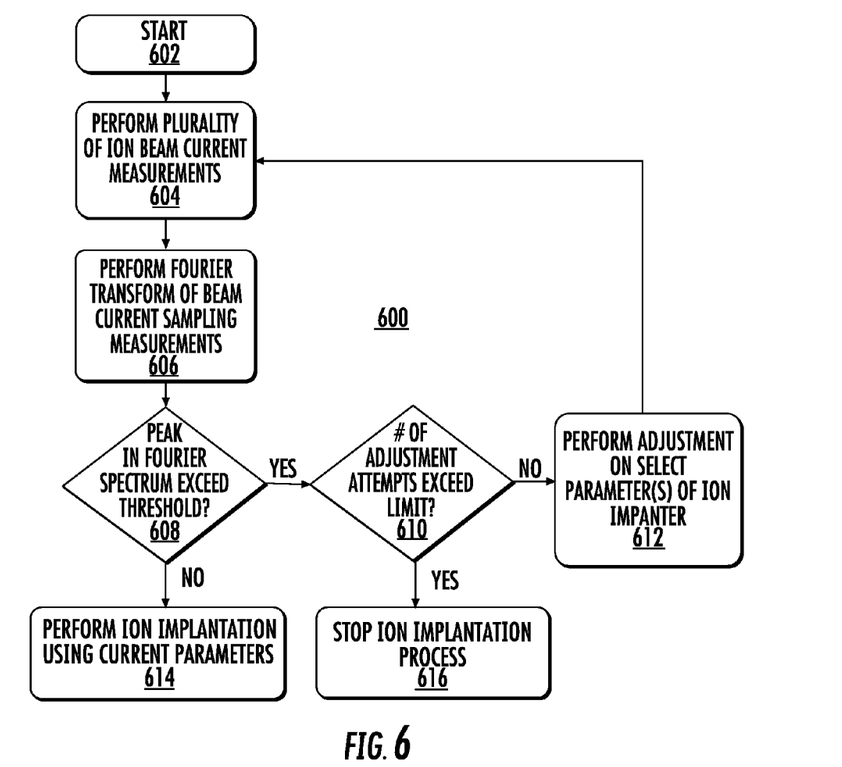
FIG. 6 shows a first exemplary logic flow.

FIG. 6 depicts a first exemplary flow 600 for control of beam current uniformity. At block 602 the flow starts. At block 604 a plurality of beam current measurements are performed. The beam current measurements may be performed at a rate of about 1 KHz in one example. In each measurement the detected beam current may be summed for the duration of a measurement which may be 1 ms in the above example. At block 606 a Fourier transform of the beam current sampling runs is performed. In one example, a discrete Fourier transform operation is performed to generate a power spectrum as a function of frequency. The flow then proceeds to the decision block 608, where a determination is made as to whether a peak or peaks in the Fourier transform spectrum exceeds a threshold value. If so, the flow proceeds to block 610. At block 610 if the number of attempts at adjusting parameters of the ion implanter has not exceeded a limit or threshold, the flow proceeds to block 612. At block 612, select parameters of the ion implanter are adjusted. The flow then returns to block 604.

If, at block 608 no peaks are identified that exceed the threshold value, the flow moves to block 614 where ion implantation is performed using the current parameters of the ion implanter. If, at block 610 the number of adjustment attempts has exceeded a limit, the flow moves to block 616 where the ion implantation process is stopped.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A system to control an ion beam in an ion implanter, comprising:
   a detector system to detect a plurality of beam current measurements of the ion beam at a first frequency;
   an analysis component to determine a variation of the ion beam based upon the plurality of beam current measurements, the variation corresponding to a beam current variation of the ion beam at a second frequency different from the first frequency; and
   an adjustment component to adjust the ion beam in response to an output of the analysis component to reduce the variation, wherein the analysis component and the adjustment component are configured to dynamically reduce the variation of the ion beam below a threshold value while the ion beam is generated in the ion implanter.

2. The system of claim 1, wherein the analysis component is configured to:
   produce a frequency domain power spectrum based upon a discrete Fourier transform of the plurality of beam current measurements; and determine the variation of the ion beam based upon a frequency domain peak identified in the frequency domain power spectrum.

3. The system of claim 2, wherein the analysis component is configured to:
calculate a figure of merit (FOM) of the frequency domain peak, wherein the FOM equals a ratio of power contained in the frequency domain peak to total power in the frequency domain power spectrum;
compare the FOM of the identified frequency domain peak to a threshold; and
flag the parameter of the ion implanter for adjustment when the FOM of the detected frequency domain peak exceeds the threshold.

4. The system of claim 1, wherein the detector system comprises:
a current detector disposed at a first position in the ion implanter and configured to detect beam current to perform the plurality of ion current measurements; and
a blocking component disposed upstream of the current detector, the blocking component configured to:
transmit all of the ion beam when a size of the ion beam and a beam position of the ion beam are within a respective beam size limit and beam position limit, and
intercept a portion of the ion beam when the size of the ion beam exceeds a beam size limit or the position of the ion beam exceeds a beam position limit.

5. The system of claim 4, further comprising a beam steering controller configured to steer the ion beam to the blocking component.

6. The system of claim 1, wherein the first frequency is greater than 16 Hz.

7. The system of claim 1, wherein the sampling run, the determination of the variation of the ion beam, and the beam adjustment together comprising a beam adjustment loop, wherein the system is configured to perform a beam adjustment loop until the variation of the ion beam is less than a threshold value.

8. The system of claim 7, wherein the analysis component is configured to terminate an ion implantation process when the variation of the ion beam exceeds a threshold value after a predetermined number of beam adjustment loops.

9. An ion implanter, comprising:
an ion source to generate an ion beam;
a detector system to detect a plurality of beam current measurements of the ion beam at a first frequency; and
a controller including at least one computer-readable storage medium comprising instructions that, when executed, cause the controller to:
determine a variation of the ion beam based upon the plurality of beam current measurements, the variation of the ion beam corresponding to a beam current variation of the ion beam at a second frequency different from the first frequency; and
generate a signal for performing adjustment of a parameter in the ion implanter when the ion beam variation is above a threshold.

10. The ion implanter of claim 9, wherein the least one computer-readable storage medium comprising instructions that, when executed, cause the controller to:
produce a frequency domain power spectrum based upon a discrete Fourier transform of ion current intensity from the plurality of ion current measurements; and
determine the ion beam variation based upon a frequency domain peak identified in the frequency domain power spectrum.

11. The ion implanter of claim 10, wherein the least one computer-readable storage medium comprising instructions that, when executed, cause the controller to:
calculate a figure of merit (FOM) of the frequency domain peak based upon power of the frequency domain peak;
compare the figure of merit of the identified frequency domain peak to a threshold;
instruct the adjustment component to perform the beam adjustment when the figure of merit of the detected frequency domain peak exceeds the threshold.

12. The ion implanter of claim 10, wherein the least one computer-readable storage medium comprising instructions that, when executed, cause the controller to steer the ion beam to steer the ion beam to a blocking component of the detector system,
the blocking component disposed upstream of a current detector of the detector system and configured to
transmit all of the ion beam when beam size and beam position are within a respective beam size limit and beam position limit, and
intercept a portion of the ion beam when beam size and/or beam position exceed the respective beam size limit and/or beam position limit.

13. The ion implanter of claim 10, wherein the first frequency being greater than 16 Hz.

14. The ion implanter of claim 10, wherein the performing the sampling run and performing the adjustment of the parameter comprising a beam adjustment loop, the at least one computer-readable storage medium comprising instructions that, when executed, cause the controller to direct an additional beam adjustment loops until the beam variation is less than a threshold value.

15. The ion implanter of claim 9, wherein the detector system comprising a plurality of Faraday detectors in an array of Faraday detectors.

16. The ion implanter of claim 9, wherein the at least one computer-readable storage medium comprising instructions that, when executed, cause the controller to send a signal to terminate an ion implantation process when the beam variation exceeds a threshold value after a predetermined number of beam adjustment loops.

* * * * *